United States Patent
Sotta et al.

(10) Patent No.: US 10,084,011 B1
(45) Date of Patent: Sep. 25, 2018

(54) GROWTH SUBSTRATE FOR FORMING OPTOELECTRONIC DEVICES, METHOD FOR MANUFACTURING SUCH A SUBSTRATE, AND USE OF THE SUSBSTRATE, IN PARTICULAR IN THE FIELD OF MICRO-DISPLAY SCREENS

(71) Applicant: Soitec, Bernin (FR)

(72) Inventors: David Sotta, Grenoble (FR); Olivier Ledoux, Grenoble (FR); Olivier Bonnin, Bresson (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 15/491,827

(22) Filed: Apr. 19, 2017

(30) Foreign Application Priority Data

Mar. 17, 2017 (FR) .................... 17 52230

(51) Int. Cl.
| | |
|---|---|
| *H01L 27/15* | (2006.01) |
| *H01L 33/00* | (2010.01) |
| *H01L 33/44* | (2010.01) |
| *H01L 33/32* | (2010.01) |
| *H01L 25/16* | (2006.01) |

(52) U.S. Cl.
CPC .......... *H01L 27/156* (2013.01); *H01L 25/167* (2013.01); *H01L 33/007* (2013.01); *H01L 33/0079* (2013.01); *H01L 33/32* (2013.01); *H01L 33/44* (2013.01); *H01L 2933/0025* (2013.01)

(58) Field of Classification Search
CPC ..... H01L 27/156; H01L 25/167; H01L 33/32; H01L 33/44; H01L 33/007; H01L 33/0079
See application file for complete search history.

(56) References Cited

U.S. PATENT DOCUMENTS

| 9,478,707 B2 | 10/2016 | Guenard |
| 2009/0045394 A1 | 2/2009 | Smeeton et al. |

FOREIGN PATENT DOCUMENTS

| EP | 0786149 | 7/1997 |
| EP | 2151852 | 2/2010 |

(Continued)

OTHER PUBLICATIONS

French Search Report and Opinion for French Application No. 1758774 dated Feb. 14, 2018, 7 pages.

(Continued)

*Primary Examiner* — William David Coleman
(74) *Attorney, Agent, or Firm* — TraskBritt

(57) ABSTRACT

A method for manufacturing a plurality of crystalline semiconductor islands having a variety of lattice parameters comprises providing a substrate including a medium, a flow layer disposed on the medium, and a plurality of strained crystalline semiconductor islands having an initial lattice parameter arranged on the flow layer. The strained semiconductor islands are selectively treated so as to form a first group of strained islands having a first lateral expansion potential, and a second group of strained islands having a second lateral expansion potential that is different from the first lateral expansion potential. The substrate is heat treated at a temperature at or above a glass transition temperature of the flow layer to cause differentiated relaxation of the islands of the first and second groups, such that a lattice parameter of the first group of relaxed islands differs from a lattice parameter of the second group of relaxed islands.

26 Claims, 3 Drawing Sheets

(56) References Cited

FOREIGN PATENT DOCUMENTS

| EP | 2151856 | 2/2010 |
|----|---------|--------|
| EP | 2865021 | 2/2017 |
| FR | 2936903 | 4/2010 |

OTHER PUBLICATIONS

French Search Report for French Application No. 1758774 dated Feb. 14, 2018, 7 pages.

Durney et al., Strain effects on indium?incorporation and optical transitions in green-light InGaN heterostructures of different orientations, Phys. Status Solidi A vol. 208, No. 11, (2011), pp. 2671-2675 (abstract only).

Liu et al., 360 PPI Flip-Chip Mounted Active Matrix Addressable Light Emitting Diode on Silicon (LEDoS) Micro-Displays, Journal of Display Technology, Apr. 2013 (abstract only).

Yin et al., Buckling suppression of SiGe islands on compliant substrates, Journal of Applied Physics (2003), 94(10), pp. 6875-6882.

French Search Report and Opinion for French Application No. 1752230 dated Feb. 15, 2018, 8 pages.

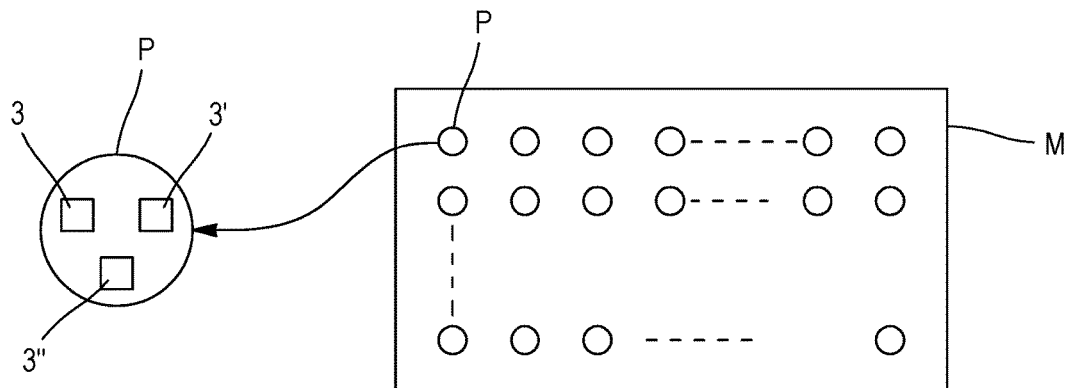
FIG. 2a
FIG. 2b
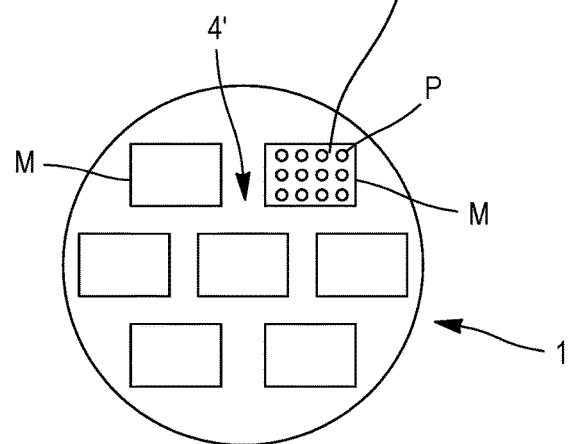
FIG. 2c

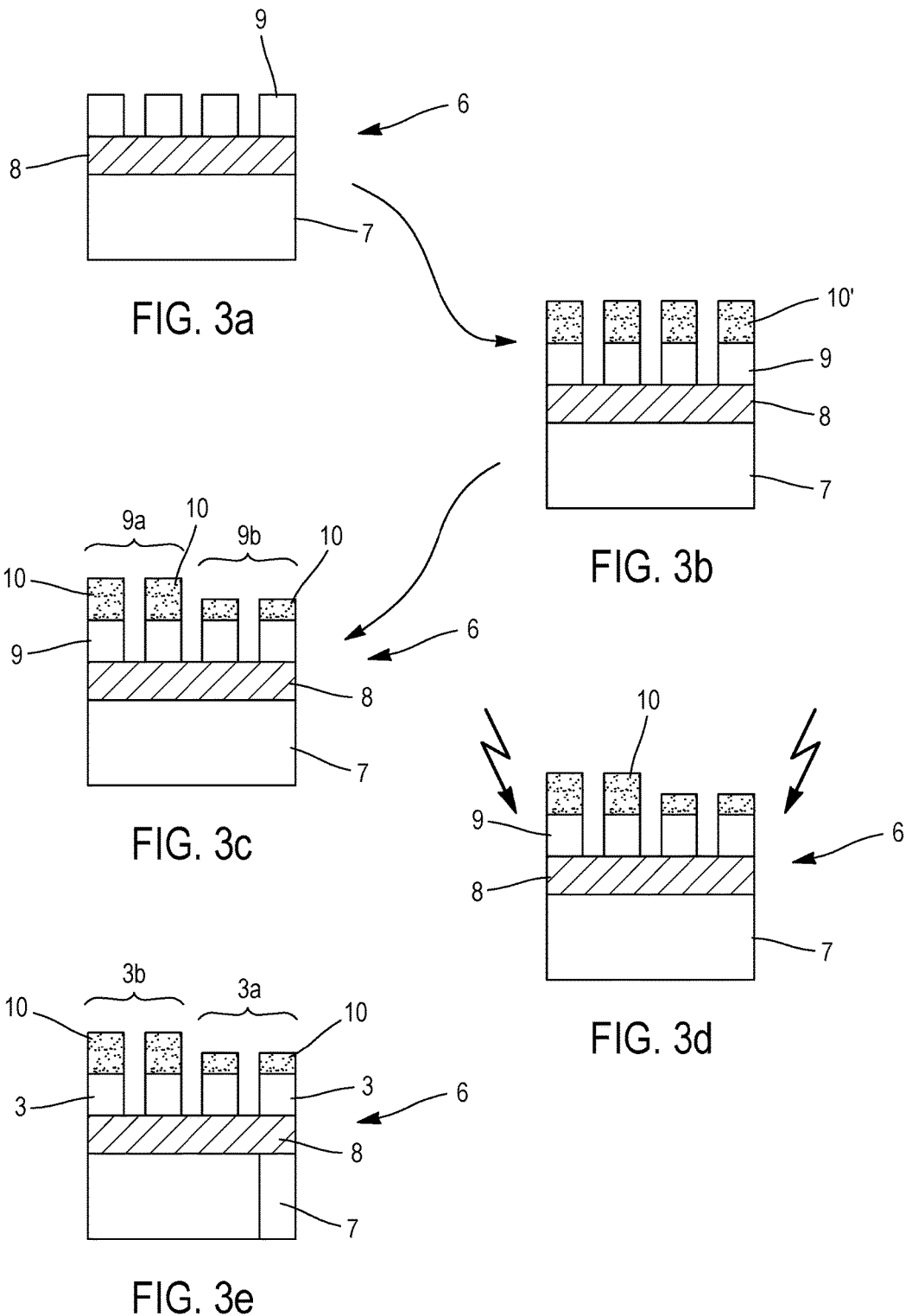

GROWTH SUBSTRATE FOR FORMING OPTOELECTRONIC DEVICES, METHOD FOR MANUFACTURING SUCH A SUBSTRATE, AND USE OF THE SUSBSTRATE, IN PARTICULAR IN THE FIELD OF MICRO-DISPLAY SCREENS

PRIORITY CLAIM

This application claims the benefit of the filing date of French Patent Application Serial No. 1752230, filed Mar. 17, 2017, for "Growth Substrate for Forming Optoelectronic Devices, Method for Manufacturing Such a Substrate, and Use of the Substrate, in Particular in the Field of Micro-Display Screens."

TECHNICAL FIELD

The present invention relates to a growth substrate for forming optoelectronic devices as well as a method for manufacturing this substrate. It also applies to the use of this substrate for the collective manufacture of devices having optoelectronic properties that can be different from one another. The invention can particularly be applied in the field of micro-display screens.

BACKGROUND

The documents EP2151852 and EP2151856 disclose a technology intended to form, on a substrate, islands of relaxed or partially relaxed crystalline semiconductor material. These islands can be used for the collective manufacture of light-emitting diodes (LEDs), as explained in detail in document EP2865021, for example.

Multiple products combine LEDs emitting at various wavelengths to form a colored light point. This is among others, the case for display screens that enable an image consisting of pixels to be formed, each pixel combining a red, a green, and a blue LED, whose emission can be controlled individually to form a light point of the selected color, by combining light emissions.

The LEDs that are combined to form the pixel are generally not manufactured from the same materials and using the same technologies. Thereby, blue or green LEDs may consist of nitride (with the general formula InGaN) and red LEDs of phosphide (with the general formula AlGaInP). Manufacturing a screen involves the assembly of the diodes, one-by-one, to form the pixels of the final device, e.g., using a pick-and-place technique.

Since the materials do not have the same properties, the characteristics pertaining to the aging, thermal/electrical behavior, and/or efficiency of the devices that use them are generally very different. These variabilities must be taken into account when designing a product that includes LEDs consisting of different materials, which may sometimes render the design very complex.

Other solutions provide for forming the pixels from diodes that are all identical, manufactured on the same substrate and/or using the same technology. Monolithic micro-LED panels having a reduced size and a high resolution can then be realized. By way of example of such a realization, one may refer to the document entitled "360 PPI Flip-Chip Mounted Active Matrix Addressable Light Emitting Diode on Silicon (LEDoS) Micro-Displays," Zhao Jun Liu et al., *Journal of Display Technology*, April 2013. The light radiation emitted by the micro-panel's LEDs can be chosen in the ultraviolet range and selectively converted, from one diode to another, to various wavelengths in order to correspond to red, green, and blue light emissions so as to form a color screen. This conversion can be achieved by placing a phosphorescent material on the emitting face of the LEDs. However, the conversion consumes light energy, which reduces the quantity of light emitted by each pixel and thus the efficiency of the display device. It also requires dispensing the phosphorescent materials on the emitting surfaces of the LEDs, which renders the manufacturing method of these micro-panels more complex.

In order to overcome the limitations discussed above, it would be desirable to be able to simultaneously manufacture, on the same substrate, using the same technology, LEDs capable of emitting in different wavelengths. More generally, it would be advantageous to collectively manufacture devices having optoelectronic properties that are different one from another.

BRIEF SUMMARY

In view of achieving one of these goals, in a first aspect, the invention provides a method for manufacturing a plurality of crystalline semiconductor islands having a variety of lattice parameters, wherein the method includes the following steps:
  providing a substrate that comprises a medium, a flow layer disposed on the medium and, arranged on the flow layer, a plurality of strained crystalline semiconductor islands having an initial lattice parameter;
  selectively treating the strained islands so as to form a first group of strained islands having a first lateral expansion potential, and a second group of strained islands having a second lateral expansion potential that is different from the first;
  heat-treating the substrate at a temperature that is higher than or equal to the glass transition temperature of the flow layer to cause differentiated relaxation of the islands of the first and second groups, the lattice parameters of the first group of relaxed islands and of the second group of relaxed islands then have different values.

According to other advantageous and non-restrictive characteristics of the invention, taken either separately or in any technically feasible combination:
  the crystalline semiconductor islands are made of III-N material;
  the selective treatment includes the formation of a stiffening layer having a first thickness on the first group of strained islands and having a second thickness on the second group of strained islands;
  the selective treatment includes the formation of an initial stiffening layer of uniform thickness on the first and second groups of strained islands; and the thinning or thickening of the initial stiffening layer on the first group of islands or on the second group of strained islands;
  the selective treatment includes the formation, on the first group of islands, of a stiffening layer formed from a first material and the formation, on the second group of islands, of a stiffening layer formed from a second material that is different from the first material;
  the stiffening layer is formed from a material chosen from the group consisting of silicon oxide and silicon nitride;
  the selective treatment includes the reduction in thickness of the islands of the first group and/or of the islands of the second group, so that they have different thicknesses;

the method includes a preliminary heat treatment step performed on the substrate before the selective treatment step is performed on the strained islands;

the method includes an additional heat treatment step performed on the substrate after the selective treatment step is performed on the strained islands;

the method includes a new selective treatment step performed on the strained islands between the heat treatment step and the additional heat treatment step;

the heat treatment and, if used, the preliminary and additional heat treatment steps are performed at a temperature ranging from 400° C. to 900° C.;

the method includes a step during which relaxed islands of the first group and relaxed islands of the second group are transferred to a growth medium;

the transfer step includes carrying over the relaxed islands of the first group and the relaxed islands of the second group to an intermediary medium.

In another aspect, the invention provides a method for the collective manufacture of a plurality of optoelectronic devices comprising active layers of varying composition, wherein the method includes the following steps:

providing a growth substrate that comprises a first group of crystalline semiconductor islands having a first lattice parameter and a second group of crystalline semiconductor islands having a second lattice parameter that is different from the first;

exposing the growth substrate to an atmosphere comprising an initial concentration of an atomic element to form a first active layer incorporating the atomic element in a first concentration on the islands of the first group and to form a second active layer incorporating the atomic element in a second concentration, which is different from the first concentration, on the islands of the second group.

According to other advantageous and non-restrictive characteristics, taken either separately or in any technically feasible combination:

the crystalline semiconductor islands are made of III-N material;

the crystalline semiconductor islands are made of InGaN;

the atmosphere is formed from precursor gases including trimethylgallium (TMGa), triethylgallium (TEGa), trimethylindium (TMIn), and ammonia;

the atomic element is indium;

the first and the second active layers comprise an n-doped InGaN layer, a multiple quantum well, a p-doped InGaN or a GaN layer.

In yet another aspect, the invention provides a growth substrate for forming the optoelectronic devices comprising a growth medium and, placed on the growth medium, a first group of crystalline semiconductor islands having a first lattice parameter and a second group of crystalline semiconductor islands having a second lattice parameter that is different from the first.

According to other advantageous and non-restrictive characteristics of this growth substrate, taken either separately or in any technically feasible combination:

the growth medium is a silicon or sapphire wafer;

the crystalline semiconductor islands are made of III-N material;

the crystalline semiconductor islands are made of InGaN;

the islands have a circular, square, triangular, or hexagonal shape;

the growth substrate comprises at least one third group of islands having a third lattice parameter that is different from the first and second;

each island of the first group is placed next to an island of the second group to form a pixel.

The invention further provides a monolithic micro-panel of light-emitting diodes comprising a panel support and a plurality of LEDs mounted on the panel support, wherein the plurality of LEDs includes at least:

a first group of LEDs capable of directly emitting a light radiation having a first wavelength and;

a second group of LEDs capable of directly emitting a light radiation having a second wavelength that is different from the first.

Lastly, the invention provides a micro-display screen comprising an assembly consisting of a monolithic micro-panel as provided above and a pilot circuit, wherein the pilot circuit comprises a plurality of LED driving circuits, each driving circuit being in contact with one LED of the monolithic micro-panel's plurality of LEDs.

BRIEF DESCRIPTION OF THE DRAWINGS

Further characteristics and advantages of the invention will be clear from the detailed description of the invention, made in reference to the accompanying drawings, among which:

FIGS. 2a, 2b, and 2c show an example of how the crystalline semiconductor islands can be arranged and distributed on the surface of a growth medium; and FIGS. 3a to 3e show a method for manufacturing a growth substrate according to the invention.

DETAILED DESCRIPTION

Growth Substrate

Figure 1A:
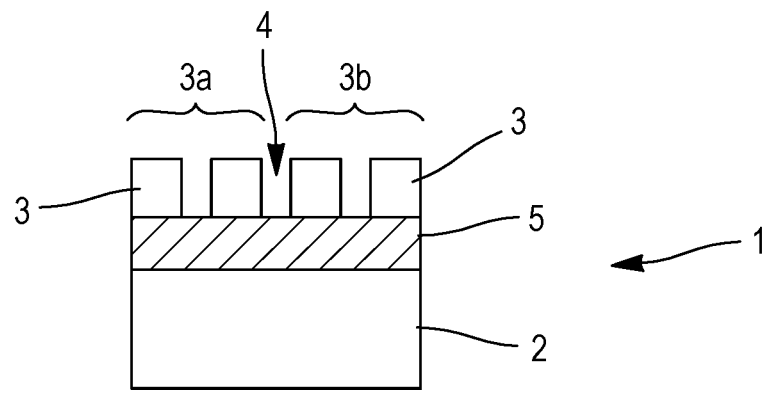
FIGS. 1a and 1b schematically show a cross-section and a top view of a growth substrate according to the invention.
Figure 1B:
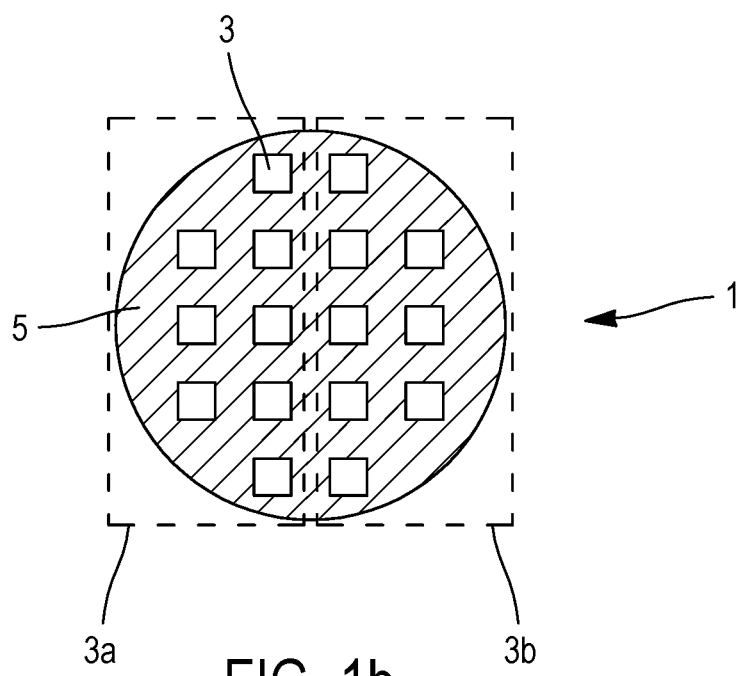

In a first aspect, the present disclosure relates to a growth substrate 1 for forming optoelectronic devices. FIGS. 1a and 1b schematically show, respectively, a cross-section and a top view of such a substrate. The growth substrate 1 is intended to be placed in deposition equipment, such as an epitaxy frame, in order to form active layers of optoelectronic components on the exposed surface of the substrate 1. The substrate 1 can also serve as a mechanical support allowing for devices to be manipulated during further manufacturing steps (formation of electrical contacts, isolation of one device from the other, etc.) leading to the achievement of a functional device.

The growth substrate 1 includes a growth medium 2. This can be a circular wafer of material(s), e.g., silicon or sapphire, of standardized dimensions, e.g., 2 inches (50 mm), 4 inches (100 mm) or even 8 inches (200 mm) in diameter. However, the disclosure is in no way restricted to these dimensions or this shape.

The nature of the growth medium 2 is generally selected so as to be able to withstand treatments (such as depositions, heat treatments, etc.) implemented when manufacturing the actual growth substrate 1 and when manufacturing optoelectronic devices. Preferably, the growth medium 2 has a thermal expansion factor similar or close to that of the materials that will form the useful layer of the optoelectronic device so as to limit the significant strains that could damage these devices following their production.

The growth substrate 1 also comprises a plurality of crystalline semiconductor islands 3 (hereinafter simply referred to as "island(s)"), placed on the growth medium 2. Each island 3 is intended to carry the active layers of an optoelectronic device, such as an LED, a laser or a photovoltaic cell. To this end, the islands 3 can be made of III-N materials. For the formation of nitride-based LEDs, the islands 3 can thus consist of InGaN, in which the indium proportion may vary between 1.5% and 8%.

The term "island" refers to a block of material that is entirely separate from the other islands arranged on the growth medium 2. The term "crystalline" means that the atoms making up an island 3 are assembled in an orderly manner to form a block of monocrystalline material, the block may nevertheless comprise arrangement defects such as dislocation, slip plane or point defects.

The islands 3 are separated one from another by trenches 4. The trenches 4 may have a lateral dimension, separating two islands 3, ranging from 1 to 50 microns (e.g., about 20 microns). Each island 3 has a relatively reduced size in relation to the growth substrate. For example, each island 3 may have a largest dimension of from 1 micron to 1 mm, depending on the intended final application. Each island 3 can have any shape, e.g., circular, square, triangular, hexagonal or rectangular, when viewed from above. Each island 3 may have a thickness of about 200 nm or less, particularly when it consists of InGaN. The islands 3 can all be of identical or different shapes and dimensions.

As will be made apparent in the description of the manufacturing method for the growth substrate 1, all islands 3 consist of the same material. However, according to the present disclosure, the islands 3 do not all have the same lattice parameter. Thus, a first group of islands 3a has a first lattice parameter and a second group of islands 3b has a second lattice parameter that is different from the first lattice parameter.

Since the materials of the islands 3 are identical to each other, the existence of a difference in the lattice parameter indicates the existence of a different strain state between the islands 3 that make up the two groups 3a and 3b.

This characteristic of the growth substrate 1 will be used advantageously to collectively manufacture optoelectronic devices that have distinct optical (e.g., light) properties, using a single manufacturing technology and on a single growth substrate.

As an example, on the first group of islands 3a that has the first lattice parameter, it will be possible to form a first LED that directly emits at a first wavelength, e.g., in the green range, and on the second group of islands 3b that has the second lattice parameter, a second LED directly emitting at a second wavelength, e.g., in the blue range. The terms "directly emitting" are used to indicate that the emission corresponds to the light radiations emitted by an LED's active layers (quantum wells), without needing to use phosphorus conversion.

It may also be provided that the growth substrate 1 comprises at least one third group of islands, this third group of islands having a third lattice parameter that is different from the first and the second. Generally, the growth substrate 1 may comprise any number of island groups, each group being formed by islands having a lattice parameter that is different from that of the islands belonging to other groups. In this way, it will be possible to obtain a growth substrate 1 allowing the formation of LEDs emitting in the range of red, green, blue, and infrared wavelengths on the same substrate using a single technology.

The distribution and arrangement of the groups of islands 3a, 3b on the surface of the growth medium 2 is not an essential characteristic of the disclosure, and all possible distributions and arrangements are contemplated. Distribution and arrangement may sometimes be dictated by the application under consideration.

A first example of a distribution and arrangement of the first and second groups of islands 3a, 3b on the surface of the medium 2 has thus been represented on FIGS. 1a and 1b. In this example, the first group of islands 3a occupies a first area of the medium 2 and the second group of islands 3b a second area of the medium 2, which are separate one from the other and adjacent to each other.

One can advantageously choose to place the islands 3, 3', 3" of a first, second, and third group of islands next to each other, which would allow the respective formation of LEDs emitting in different colors, e.g., red, green, and blue, respectively. This arrangement has been represented schematically in FIG. 2a. Such a combination of LEDs constitutes a bright pixel P whose emission color can be controlled. The islands 3, 3', 3" that will carry the LEDs constituting these pixels P can be arranged in a regular manner on the surface of the growth medium 2 (FIG. 1a). Monolithic pixels P may thus be formed, i.e., placed on the same substrate and handleable as a pixel, e.g., by a component insertion device, in order to be included in a functional device.

In the case where the formation of a monolithic micropanel of LEDs is aimed, e.g., for a color micro-display screen, the pixels P could, for example, be distributed evenly according to lines and rows to form a matrix M, as represented in FIG. 2b. A growth substrate 1 may comprise a plurality of such matrices M, as represented in FIG. 2c.

Returning to the description of FIGS. 1a and 1b, and beyond the growth medium 2 and the crystalline semiconductor islands 3, the growth substrate 1 may comprise other elements or other layers. It may thus be provided that at least one assembly layer 5 is used to facilitate the manufacturing of the growth substrate 1, as will be described below. This assembly layer 5 may be a silicon oxide or silicon nitride layer, or may consist of a stack of such layers.

Method for Manufacturing a Growth Substrate

With reference to FIGS. 3a to 3e, disclosed is an example of a method for manufacturing a growth substrate according to the disclosure.

The method implements the principles of the crystalline semiconductor island transfer and relaxation technology, such as they are described in documents EP 2151852, EP 2151856 or FR 2936903.

Recalling that, according to an exemplary implementation that complies with this approach, one starts by forming a strained crystalline semiconductor layer on a donor substrate. This layer is then transferred to a substrate comprising a flow layer by bonding and by thinning and/or fracturing the donor substrate. The islands are then defined in the transferred layer, and a heat treatment is subsequently performed on the substrate and the islands at a temperature that is higher than the viscosity transition temperature of the flow layer, which may consist of borophosphosilicate glass (BPSG), for example, which leads to at least partial relaxation of the islands. The degree of relaxation achieved following the relaxation heat treatment can reach 70% to 80% of the maximum degree of relaxation corresponding to the achievement of a perfectly relaxed layer. This degree of relaxation depends on the thickness of the islands, as well as on the duration and extent of the heat treatment.

To assist this relaxation and prevent an island warpage phenomenon during the plastic deformation that takes place during relaxation, a stiffening layer may be formed on the islands prior to applying the relaxation heat treatment. As explained in detail in the document entitled "Buckling Suppression of SiGe Islands on Compliant Substrates," Yin et al. (2003), *Journal of Applied Physics*, 94(10), 6875-6882, the degree of relaxation of an island achieved after this heat treatment step is that which balances the strains in the stiffening layer and in the island. Note that the stiffening layer can be formed from (or include) a residue of the donor substrate that would have been preserved on the strained layer following its transfer to the flow layer.

The present disclosure takes advantage of the relaxation phenomenon to provide a method for manufacturing a plurality of crystalline semiconductor islands having a variety of lattice parameters.

As shown in FIG. 3a, the manufacturing method according to the disclosure includes the supply of a relaxation substrate comprising a relaxation medium 7, a flow layer 8 disposed on the medium 7 and, arranged on the flow layer 8, a plurality of strained crystalline semiconductor islands 9. The strained islands 9 all have the same lattice parameter. One can refer to the above-mentioned documents regarding the state of the art to choose the composition and configuration of the relaxation medium 7 and of the flow layer 8.

The strained islands 9 may come from a donor substrate and may have been transferred to the flow layer 8 of the relaxation substrate 6 using the bonding and thinning steps briefly mentioned above. As an example, the donor substrate may consist of a sapphire base medium, a GaN buffer layer formed on the base substrate, and an InGaN strained layer with a proportion of indium ranging from 1.5% to 10% on the GaN buffer layer. Traditional photolithography, resin depositing, and etching steps may have been used to define the strained InGaN islands 9 from the continuous InGaN layer. These steps may have been applied before or after the transfer steps. As mentioned above, the islands 3 may carry a stiffening layer 10' that is a residue of the donor substrate. Stiffening layer 10' could be the GaN from 10 nm to 100 nm thick that initially formed the buffer layer of the donor substrate.

Regardless of the manner in which the relaxation substrate 6 may have been formed, in a subsequent step of the manufacturing method, the strained islands 9 of the relaxation substrate are treated selectively so as to form a first group of strained islands 9a having a first lateral expansion potential and a second group of strained islands 9b having a second lateral expansion potential that is different from the first. In other terms, the strain energy contained in an island of the first group of strained islands 9a is different from the strain energy contained in an island of the second group of strained islands 9b.

Such selective treatment may include the formation of a stiffening layer 10 having a first thickness on the first group of strained islands 9a of the relaxation substrate 6 and having a second thickness on the second group of strained islands 9b. This arrangement is represented in FIG. 3c.

This thickness configuration of the stiffening layer 10 may be achieved by forming an initial stiffening layer 10' of uniform thickness on all islands 9, as shown in FIG. 3b, and then by selectively thinning this layer 10' to reduce its thickness on one of the two groups of islands 9a, 9b. Again, lithographic photo-masking steps can be used to protect the stiffening layer 10 disposed on one of the two island groups 9a, 9b against this thinning treatment. As an alternative to thinning, one can also choose to thicken the initial stiffening layer 10' on one of the two island groups 9a, 9b to end up with the configuration in FIG. 3c. As discussed above, this stiffening layer 10' of uniform thickness can consist of a residue of the donor substrate.

As an alternative or in addition, rather than modifying the thickness of the stiffening layer 10 or one island group in relation to another, one can choose to vary its nature. One can thus have a stiffening layer 10 formed from a first material on a first group of islands 9a and a stiffening layer 10 formed from a second material having a stiffness or rigidity that is different from the first material on the second group of islands 9b. In this case, the stiffening layer 10 may have a uniform thickness from one group of strained islands 9a, 9b to another.

For reasons of availability and cost, the stiffening layer 10 is typically composed of a silicon oxide or a silicon nitride. In additional embodiments, the stiffening layer 10 may be any other material that is sufficiently rigid to modify the lateral expansion potential of the island 9 on which it rests and potentially reduce or prevent the warpage of this island 9 during the relaxation heat treatment that follows. According to the nature of this layer and on the expected degree of relaxation of the island 9 on which it is disposed, the stiffening layer 10 can have a thickness ranging from 10 nm to several hundreds of nm, such as 200 nm.

In some embodiments, certain islands 9 may not be coated with a stiffening layer 10. This is particularly the case when the island's degree of strain is relatively low and, thus, when the risk of warpage of the island is low.

The selective treatment aiming to affect the lateral expansion capacity of the islands 9 in a differentiated manner may also include the thinning of certain islands 9, i.e., reducing the thickness of the islands 9a of the first group and/or the thickness of the islands 9b of the second group of islands so that these islands 9a, 9b have different thicknesses following this treatment. This may, for example, include thinning at least one group of islands 9a, 9b, by 10% to 50% of its initial thickness in order to create a difference in thickness between the groups of islands that can be greater than 10%.

Any two or more of the selective treatments that have just been described may be combined with one another in some embodiments. In all cases, following this treatment aiming to form at least two groups of islands 9a, 9b, there is a first group of islands 9a having at least one characteristic (thickness, thickness or nature of a carried stiffening layer) that differs from the characteristic of a second group of islands 9b. Consequently, they have a differing lateral expansion potential or capacity.

In a subsequent step of the manufacturing method, shown in FIG. 3d, the relaxation substrate 6 is heat-treated at a temperature that is higher or equal to the glass transition temperature of the flow layer 8. According to the nature of flow layer 8, this heat treatment may include exposing the relaxation substrate 6 to a temperature comprised between 400° C. and 900° C. for a period ranging from a few minutes to several hours. This is particularly the case when the flow layer consists of BPSG. Proceeding in this way causes the relaxation of the strained islands 9 of the first and second groups of islands 9a, 9b to form at least partially relaxed islands 3, shown in FIG. 3e. As has been well documented, the degree of relaxation achieved during and following the relaxation heat treatment depends on the thickness of the island 9, the thickness and/or on the nature of the stiffening layer 10 that may possibly cover this island 9.

The strained islands of the first group 9a and the strained islands of the second group 9b have different characteristics and thus a different lateral expansion potential, the heat treatment leads to relaxing, to varying degrees, the initially strained islands 9 of the first and second group 9a, 9b. In other terms, following the relaxation heat treatment, the lattice parameter of the islands 3 of the first group 3a is different from the lattice parameter of the islands 3 of the second group 3b.

To reach the right level of relaxation and the target lattice parameter for each of the groups of islands 3a, 3b, the relaxation heat treatment step may be repeated in some embodiments.

For example, a preliminary relaxation heat treatment step may be provided prior to selectively treating the islands 9 in view of differentiating them. In this case, all the islands 9 are relaxed to the same degree of relaxation. It may also be provided that the thickness of the islands 9 is modified or that the stiffening layer 10 of the first group and/or of the second group of islands 3a, 3b, or of any other group of islands, is thinned or thickened prior to applying an additional relaxation heat treatment step. In this way, the lattice parameters of the islands 3 arranged on the relaxation substrate 6 may be refined by repeating a cycle of selective treatment of the islands and of application of a relaxation heat treatment. As has already been mentioned, more than two groups of islands 3a, 3b may be formed and processed as described herein.

Generally, any step aiming to modify a characteristic of a group of strained islands 9a, 9b affecting the lateral expansion capacity of the islands may be combined with relaxation heat treatment steps, so that each island has a lattice parameter that is close or identical to a target lattice parameter following this treatment.

Following the manufacturing method described above, the relaxed islands 3 may be transferred to another medium. This transfer may include carrying the islands 3 over to an intermediary medium prior to transferring them to the other medium. For example, one can choose to transfer the islands 3 to a growth medium 2, possibly via an assembly layer 5, which would then allow having a growth substrate 1 such as has been described above and shown in FIG. 1a. A growth substrate that does not contain any flow layer is thus obtained, since the flow layer may be incompatible with the steps required to manufacture the active layers of the optoelectronic devices. Moreover, in the case where the islands are composed of a polar material, this transfer allows retrieving the initial polarity of this material, such as it had been formed on the donor substrate, from the exposed face of the growth medium 1.

Method for Manufacturing a Plurality of Optoelectronic Devices

According to another aspect, the disclosure also relates to a method for the collective manufacture of a plurality of optoelectronic devices. According to the disclosure, these devices each comprise active layers that may be different from one device to another. The devices then have optoelectronic properties that differ from each other. The term "collective manufacturing" is used to mean that the manufacture of these devices uses a single technology applied to a single substrate to form the active layers.

This method includes supplying a growth substrate 1 in line with the general description provided above. It therefore at least comprises a first group of crystalline semiconductor islands 3a having a first lattice parameter and a second group of crystalline semiconductor islands 3b having a second lattice parameter that is different from the first lattice parameter.

The following step is aimed at forming the active layers by growth on the exposed face of the islands 3. As is well known as such, to achieve this, the growth substrate is placed in a deposition chamber, e.g., that of an epitaxy frame. During deposition, streams of precursor gases flow through such a chamber, these gases comprising the atomic elements that compose the active layers to be deposited on the islands 3. The precursor gases are heated to a temperature above the growth substrate 1 so as to free the atomic elements and to enable their adsorption on the surface of the growth substrate 1 and, in particular, on the surface of the islands 3. According to the nature, the relative concentration, and the period during which these precursor gases circulate, the nature and the thickness of these layers, which are progressively formed on the crystalline semiconductor islands 3, can be controlled. If this is necessary, it may be provided that p-type or n-type doping agents are introduced in the chamber to form doped layers. In particular, the precursor gases can be controlled to form active layers of electronic devices, such as quantum wells or LED heterostructures, on the islands.

By way of example, an active layer of LEDs may include the following layer stack on an island 3 composed of InGaN having an In concentration ranging from 1.5% to 10%, and at least partially relaxed (typically to the order of 70%):

an n-doped InGaN layer having an In concentration similar to that of the island 3;

a multiple quantum well comprising a plurality of layers, each layer comprising a distinct proportion of indium, having a difference of a few percentage points in relation to that of the underlying n-doped layer. The quantum well is capable of emitting a light radiation of a wavelength selected according to the nature of the layers that it consists of;

a p-doped InGaN layer having an In concentration ranging from 0 to 10%. To simplify its manufacturing, the p-doped layer may be formed from GaN.

The precursor gases used to form these active layers of LEDs can include trimethylgallium (TMGa), triethylgallium (TEGa), trimethylindium (TMIn), and ammonia ($NH_3$).

The incorporation of certain atomic elements of the precursor gases in the deposited layer is affected by the lattice parameter of this layer. This is particularly the case for what concerns the incorporation of indium in an InGaN layer, as has been reported in the document entitled "Strain Effects on Indium Incorporation and Optical Transitions in Green-Light InGaN Heterostructures of Different Orientations," by M. V. Durnev et al., *Phys. Status Solidi A* 208, No. 11, 2671-2675 (2011). It appears that the solubility of indium in a material increases as the lattice parameter of this material increases. In other words, all other things being equal, the incorporation of indium in a material during its formation by deposition increases with the lattice parameter of the material into which it is incorporated.

The present disclosure takes advantage of this observation to form the growth substrate 1 of the active layers of a plurality of optoelectronic devices, these active layers may be different from one device to another. The method generally implements a step in which the growth substrate 1 is exposed to an atmosphere comprising at least one initial concentration of an atomic element.

On the islands 3 of the first group of islands 3a of the growth substrate 1, which has a first lattice parameter, the atomic element is incorporated in the active layer in a first concentration. On the islands 3 of the second group of islands 3b, which has a second lattice parameter that is different from the first lattice parameter, the atomic element is incorporated in the active layer according to a second concentration that is different from the first. If the second lattice parameter is greater than the first, the second concentration will be greater than the first concentration.

In other words, the first and second concentrations are determined by the initial concentration of the atomic species in the chamber and by the first and the second lattice parameters of the islands. As is well-known in the field of material growth, other parameters may also influence the nature of the layers that are formed as, for example, the partial pressure of the chamber, the temperature, the respective flow of the precursor gases, etc.

By providing a growth substrate for which the first and the second lattice parameters have been adequately selected, it is possible to form active layers having different optoelectronic properties. By way of example, the proportion of indium incorporated in the InGaN active layers deposited on the islands of the first group of islands may lead to the formation of LEDs directly emitting a radiation within the blue range. At the same time, the proportion of indium incorporated in the InGaN active layers deposited on the islands of the second group of islands can lead to the formation of LEDs directly emitting a radiation within the green range.

Once the active layers have been formed on the islands, one can proceed with the method of manufacturing electronic devices, in particular to form the electrical contacts and to isolate the devices one from another, as is described in U.S. Pat. No. 9,478,707, for example. It may also be provided that the islands 3 coated with their active layers are carried over to an LED support and that the growth medium 2 is eliminated.

Application to the Manufacturing of a Monolithic Micro-Panel of LEDs and to a Micro-Display Screen A specific application of the growth substrate and of the collective manufacturing method described above aims to manufacture a monolithic micro-panel of LEDs.

Such a micro-panel consists in an arrangement of LEDs, generally all identical and of very small size, arranged into rows and columns at a constant pitch on a panel support. When the LEDs have been manufactured collectively, the micro-panel is said to be "monolithic." This characteristic is advantageous, since the LEDs then have very similar properties (such as the current and/or voltage behavior, changes with ageing, etc.), which facilitates the design and the manufacturing of the micro-panel. Within the scope of the present disclosure, a micro-panel in which all the LEDs have been manufactured collectively and extracted collectively from the same manufacturing medium to form the micro-panel will be designated as a "monolithic micro-panel"; or as "a micro-panel consisting of monolithic pixels," i.e., each pixel consists of LEDs manufactured collectively and extracted collectively from the same manufacturing medium. In this case, the monolithic pixels are assembled together so as to form the micro-panel.

The monolithic micro-panel of LEDs can be assembled with a pilot circuit using a "flip-chip" technology, which allows performing the electrical connection of each LED of the micro-panel with a driving circuit of the pilot circuit. This assembly process may involve assembling an entire monolithic micro-panel with a pilot circuit, each LED of the micro-panel being associated with a driving circuit after assembly. In other embodiments, the assembly process may involve successively assembling one or a plurality of monolithic pixels to the pilot circuit to associate them with the pilot circuit. Regardless of the chosen approach, a monolithic micro-display screen is formed when proceeding in this way.

Since the LEDs all have identical or similar electrical properties, the driving circuits of the pilot circuit may also have identical or similar electrical properties, which facilitates the manufacturing of the micro-display screen.

A detailed discussion of this device and its manufacturing method can be found in "Monolithic LED Microdisplay on Active Matrix Substrate Using Flip-Chip Technology," Liu et al., *IEEE Journal of Selected Topics in Quantum Electronics* (Vol. 15, Issue 4, July-August 2009).

Known monolithic micro-panels all consist of LEDs directly emitting a single wavelength thus enabling monochrome display. Color display is achieved via the phosphorus conversion placed on the emitting face of some of these LEDs, or by optically combining a plurality of micro-panels each emitting a radiation chosen in a combination of complementary colors, e.g., red, green and blue. These techniques are not advantageous for obvious reasons of complexity of implementation, of efficiency, and of density, as has been previously discussed herein.

On the contrary, the methods and substrates according to the present disclosure can be used to provide a monolithic micro-panel of LEDs comprising a panel support and a plurality of LEDs arranged on this panel. The plurality of LEDs includes a first group of LEDs capable of directly emitting a light radiation having a first wavelength and a second group of LEDs capable of directly emitting a second light radiation having a second wavelength that is different from the first wavelength.

A micro-panel according to the disclosure is, thus, capable of emitting different colors without needing to optically combine a plurality of micro-panels or to apply conversion means. For applications in the field of color displays, the micro-panel comprises at least three groups of LEDs, each group emitting a wavelength that is different from that of the others. There can, for example, be a first group of LEDs directly emitting in the red, a second group of LEDs directly emitting a radiation in the green, and a third group of LEDs directly emitting a radiation in the blue. Having a fourth group of LEDs directly emitting in the infrared can also be considered, this illumination being used to provide additional features to the device in which the micro-panel is integrated (tactile function, eye iris recognition, motion sensing, etc.).

For applications in the field of color displays, the LEDs of each group are arranged evenly on the panel support, e.g., spaced at a constant pitch along rows and columns in order to form a display matrix. The LEDs are also arranged side-by-side, or more precisely, in close proximity to each other, an LED of each group so as to form a bright pixel, whose color can be controlled, in each location of the matrix.

The micro-panel may consist of LEDs that can be used to form a matrix of large-sized pixels, e.g., of 50 pixels by 50 pixels, or of 200 pixels by 200 pixels, if not more.

Even though the bright pixels of the panel consist of LEDs emitting in different wavelengths, these LEDs have been formed collectively using a single technology and on a single substrate. They thus have properties, and more specifically electrical and ageing properties, that are very similar with each other, which allows associating them with a pilot circuit consisting of driving circuits that are all identical or very similar.

Now disclosed is an example of how a micro-panel and/or a micro-display screen is prepared.

A growth substrate 1 comprising a growth medium 2 provided with a silicon oxide assembly layer 5 is first prepared. The growth medium 2 may, for example, consist of a silicon wafer 150 mm in diameter. The growth substrate 1 includes three groups of InGaN islands 3a, 3b, 3c containing 8% of indium. The islands 3a, 3b, 3c, all have a thickness of 200 nm and a square shape of 50 microns on a side. The first group of islands 3a has a lattice parameter of 0.3190 nanometers, the second group of islands 3b has a lattice parameter of 0.3200 nanometers, and the third group of islands 3c has a lattice parameter of 0.3205 nm. These target lattice parameters have been chosen so that the collective manufacturing step of the active layers of LEDs leads to the formation of LEDs emitting radiations in the blue, green, and red.

The islands 3 that make up each of these groups are distributed and arranged on the growth medium 2 according to a matrix arrangement in line with what has been disclosed in relation with the description of FIGS. 2*a* to 2*c*. Three islands 3, 3', and 3" of each of the groups are thus arranged in close proximity to each other so as to define a pixel, and these groupings of islands are distributed according to a matrix along the rows and lines on the surface of the growth substrate 1. Panel trenches 4' (FIG. 2*c*) that are larger than the trenches 4 separating the two islands may be provided to separate the matrices one from another, each matrix delimiting a set of islands 3, 3', 3" intended to carry the LEDs of a micro-panel.

To manufacture this growth substrate 1, a relaxation substrate 6 comprising a relaxation medium 7, e.g., made of sapphire and also 150 mm, and a flow layer 8 consisting of BPSG are first prepared. The relaxation substrate 6 also comprises strained InGaN islands 9 containing 8% indium. These strained islands 9 are arranged in a similar manner as what has been described above for the relaxed islands 3 of the growth substrate 1. Likewise, the lattice parameter of these strained islands 9 is 0.3185 nanometers.

The strained islands 9 are coated with an initial GaN stiffening layer 10' having a thickness of 50 nm, which is a residue of a GaN buffer layer of a donor substrate used to realize the relaxation substrate. A relaxation heat treatment is performed, for example, at 800° C. for one hour. This treatment leads to the relaxation of the initially strained islands 9 to form partially relaxed islands 3 that have a lattice parameter close to 0.3190 nanometers following the relaxation heat treatment. If this is not the case, the relaxation heat treatment can be applied again, possibly by thinning the initial stiffening layer to promote the relaxation of the islands 3.

Only the stiffening layer 10' that covers the islands 3 of the second and third groups is then eliminated through etching, and then the relaxation heat treatment is renewed. It may also be provided that the islands 3 of the second and third groups are thinned, e.g., by 40 nm, to promote their relaxation. Following the treatment, the lattice parameter of the islands of the first group, coated with the stiffening layer 10, has not changed much, e.g., close to 0.3190 nm. However, the lattice parameter of the islands of the second and third groups has increased to close to 0.3200 nm.

In a subsequent step, only the islands of the third group are thinned, e.g., by 70 nm, and the relaxation heat treatment is applied again. The lattice parameters of the islands of the first and second groups remain relatively constant and are in any case less affected by this heat treatment than the lattice parameter of the islands of the third group, which is then close to 0.3205 nm.

This final relaxation heat treatment can be renewed, possibly in combination with a thinning of the stiffening layer disposed on the islands of the first group or a thinning of the islands of the second and third groups to make the lattice parameters of these islands converge toward their target lattice parameters.

In any event, repeating these steps leads to the selective relaxation of the island groups and, following these steps, the first group of islands 3*a* has a lattice parameter of, or close to, 0.3190 nanometers, the second group has a lattice parameter of, or close to, 3.200 nanometers, and the third group has a lattice parameter of, or close to, 3.205 nm.

The partially relaxed InGaN islands 3 are then carried over by bonding on a growth medium 2 provided with an assembly layer 5, e.g., a multilayer of silicon dioxide and nitride.

The resulting structure is then placed in a chamber of an epitaxy frame, in which a set of precursor gases (TMGa, TMIn, and $NH_3$) is circulated in order to make active layers of nitride-based LEDs grow on each of the islands.

The lattice parameters of the islands of the first group, of the second group, and of the third group of islands being different from each other, the incorporation of indium in the active layers of InGaN that form on the islands of these groups also is different. On the islands of the first group, LEDs directly emitting radiation in the blue range are obtained, on the islands of the second group LEDs directly emitting radiation in the green range are obtained, and on the islands of the third group LEDs directly emitting radiation in the red range are formed.

Following this deposition step, on the growth substrate 1, there, thus, are active layers of LEDs arranged at the level of a pixel and emitting colors in the red, green, and blue ranges.

The manufacturing of a functional LED on the growth substrate can be completed, among others, by forming the LED contacts on either side of the active layers.

If at this stage, monolithic micro-panels are desired, the wafer on which the formed LEDs rest can be cut along the trenches 4' defining the pixel matrices. Each of these matrices then constitutes a micro-panel.

Alternatively, the wafer comprising the micro-panels may also be assembled with a second wafer on which pilot circuits, consisting of a matrix of driving circuits, have been formed. Each matrix is arranged on the surface of this wafer according to the same arrangement as the LEDs on the growth substrate. The assembly enables electrically contacting each diode with a driving circuit. A plurality of display screens is constituted in a single contacting step. It can then be decided that the growth medium 7 be eliminated, e.g., by laser irradiation, and the assembly layer 8, e.g., by chemical etching, so as to expose a light emission surface of the LEDs. These surfaces can be prepared using optical surface treatments or protection elements in order to improve the quality and the robustness of the screen. The wafer can be cut out in a conventional manner so as to isolate the screens from each other in view of packaging them.

What is claimed is:

1. A method for manufacturing a plurality of crystalline semiconductor islands having a variety of lattice parameters, comprising:

providing a substrate including a medium, a flow layer disposed on the medium, and a plurality of strained crystalline semiconductor islands having an initial lattice parameter arranged on the flow layer;

selectively treating the strained crystalline semiconductor islands so as to form a first group of strained islands having a first lateral expansion potential, and a second group of strained islands having a second lateral expansion potential that is different from the first lateral expansion potential;

heat-treating the substrate at a temperature that is higher than or equal to a glass transition temperature of the flow layer to cause differentiated relaxation of the islands of the first and second groups such that a lattice parameter of the first group of relaxed islands differs from a lattice parameter of the second group of relaxed islands.

2. The method of claim 1, wherein the crystalline semiconductor islands are made of III-N material.

3. The method of claim 1, wherein selectively treating the strained crystalline semiconductor islands includes the formation of a stiffening layer having a first thickness on the first group of strained islands and having a second thickness on the second group of strained islands.

4. The method of claim 1, wherein selectively treating the strained crystalline semiconductor islands includes the formation, on the first group of strained islands, of a stiffening layer formed from a first material and the formation, on the second group of strained islands, of a stiffening layer formed from a second material that is different from the first material.

5. The method of claim 1, wherein selectively treating the strained crystalline semiconductor islands includes reducing a thickness of the strained islands of the first group and/or of the strained islands of the second group, such that the strained islands of the first group and the strained islands of the second group have different thicknesses.

6. The method of claim 1, further comprising performing a preliminary heat treatment on the substrate before selectively treating the strained crystalline semiconductor islands.

7. The method of claim 1, further comprising performing an additional heat treatment on the substrate after selectively treating the strained crystalline semiconductor islands.

8. The method of claim 1, wherein heat-treating the substrate comprises heat-treating the substrate at a temperature in a range extending from 400° C. to 900° C.

9. The method of claim 1, further comprising transferring the relaxed islands of the first group and the relaxed islands of the second group to a growth medium.

10. The method of claim 3, wherein selectively treating the strained crystalline semiconductor islands includes the formation of an initial stiffening layer of uniform thickness on the first and second group of strained islands, and the thinning or thickening of the initial stiffening layer on the first group of islands or on the second group of strained islands.

11. The method of claim 3, wherein the stiffening layer comprises a material selected from the group consisting of silicon oxide and silicon nitride.

12. The method of claim 7, further comprising selectively treating the first and second groups of islands after heat-treating the substrate and before performing the additional heat treatment on the substrate.

13. The method of claim 9, further comprising transferring the relaxed islands of the first group and the relaxed islands of the second group to an intermediary medium prior to transferring the relaxed islands of the first group and the relaxed islands of the second group to the growth medium.

14. A method for the collective manufacture of a plurality of optoelectronic devices comprising active layers of varying composition, comprising:

providing a growth substrate comprising a first group of crystalline semiconductor islands having a first lattice parameter and a second group of crystalline semiconductor islands having a second lattice parameter that is different from the first lattice parameter, the first and second groups of crystalline semiconductor islands being disposed on an assembly layer;

exposing the growth substrate to an atmosphere comprising an initial concentration of an atomic element to form a first active layer incorporating the atomic element in a first concentration on the islands of the first group and to form a second active layer incorporating the atomic element in a second concentration on the islands of the second group, the second concentration being different from the first concentration.

15. The method of claim 14, wherein the crystalline semiconductor islands comprise a III-N material.

16. The method of claim 14, wherein the atmosphere comprises one or more precursor gases selected from the group consisting of trimethylgallium (TMGa), triethylgallium (TEGA), trimethylindium (TMIn), and ammonia.

17. The method of claim 14, wherein the atomic element is indium.

18. The method of claim 15, wherein the crystalline semiconductor islands comprise InGaN.

19. The method of claim 17, wherein the first and the second active layer comprise an n-doped InGaN layer, a multiple quantum well, and a p-doped InGaN or GaN layer.

20. A growth substrate for forming optoelectronic devices, comprising:
a growth medium;
an assembly layer; and
a first group of crystalline semiconductor islands having a first lattice parameter and a second group of crystalline semiconductor islands having a second lattice parameter that is different from the first lattice parameter, the first group of crystalline semiconductor islands and the second group of crystalline semiconductor islands arranged on the assembly layer.

21. The growth substrate of claim 20, wherein the growth medium is a silicon or sapphire wafer.

22. The growth substrate of claim 20, wherein the crystalline semiconductor islands comprise III-N material.

23. The growth substrate of claim 20, wherein the islands have a circular, square, triangular, or hexagonal shape.

24. The growth substrate of claim 20, further comprising at least a third group of crystalline semiconductor islands having a third lattice parameter that is different from the first lattice parameter and the second lattice parameter.

25. The growth substrate of claim 20, wherein each island of the first group is placed next to an island of the second group to form a pixel.

26. The growth substrate of claim 22, wherein the crystalline semiconductor islands comprise InGaN.

* * * * *